United States Patent
Cole et al.

(10) Patent No.: US 7,332,737 B2
(45) Date of Patent: Feb. 19, 2008

(54) ISOLATION TRENCH GEOMETRY FOR IMAGE SENSORS

(75) Inventors: Bryan G. Cole, Boise, ID (US); Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 10/872,408

(22) Filed: Jun. 22, 2004

(65) Prior Publication Data

US 2005/0279998 A1 Dec. 22, 2005

(51) Int. Cl.
*H01L 29/06* (2006.01)
*H01L 29/80* (2006.01)
*H01L 31/00* (2006.01)

(52) U.S. Cl. ............... 257/29; 257/59; 257/258
(58) Field of Classification Search ............ 257/59, 257/258, 290–293, 29
See application file for complete search history.

(56) References Cited

U.S. PATENT DOCUMENTS

| 5,651,858 A * | 7/1997 | Lin ............... 438/706 |
| 5,834,358 A | 11/1998 | Pan et al. |
| 5,868,870 A | 2/1999 | Fazan et al. |
| 6,093,953 A | 7/2000 | Pan et al. |
| 6,177,333 B1 | 1/2001 | Rhodes |
| 6,204,524 B1 | 3/2001 | Rhodes |
| 6,232,626 B1 | 5/2001 | Rhodes |
| 6,677,656 B2 * | 1/2004 | François ............ 257/462 |
| 2004/0089914 A1 | 5/2004 | Mouli |
| 2004/0092054 A1 | 5/2004 | Mouli |
| 2004/0094784 A1 | 5/2004 | Rhodes et al. |
| 2004/0178430 A1 | 9/2004 | Rhodes et al. |

OTHER PUBLICATIONS

R. H. Nixon, et al.—"256×256 CMOS Active Pixel Sensor Camer-on-a-Chip," IEEE Journal of Solid State Circuits, vol. 31, No. 12, Dec. 1996, pp. 2046-2050.
Sunetra Mendis, et al.—"CMOS Active Pixel Image Sensor," IEEE Transactions on Electron Devices, vol. 41, No. 3, Mar. 1994, pp. 452-453.
Pending U.S. Appl. No. 10/922,831 Jin, filed Aug. 23, 2004.
Pending U.S. Appl. No. 10/694,990 Rhodes, filed Oct. 29, 2003.

* cited by examiner

*Primary Examiner*—Howard Weiss
*Assistant Examiner*—Steven H Rao
(74) *Attorney, Agent, or Firm*—Dickstein Shapiro LLP (57) ABSTRACT

A pixel cell including a substrate having a top surface. A photo-conversion device is at a surface of the substrate and a trench is in the substrate adjacent the photo-conversion device. The trench has sidewalls and a bottom. At least one sidewall is angled less than approximately 85 degrees from the plane of the top surface of the substrate.

41 Claims, 10 Drawing Sheets

ISOLATION TRENCH GEOMETRY FOR IMAGE SENSORS

FIELD OF THE INVENTION

The present invention relates generally to semiconductor devices, and more particularly, to trench isolation technology for use in semiconductor devices, including CMOS image sensors.

BACKGROUND OF THE INVENTION

CMOS image sensors are increasingly being used as low cost imaging devices. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor, for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state before the transfer of charge to it; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

Figure 1:
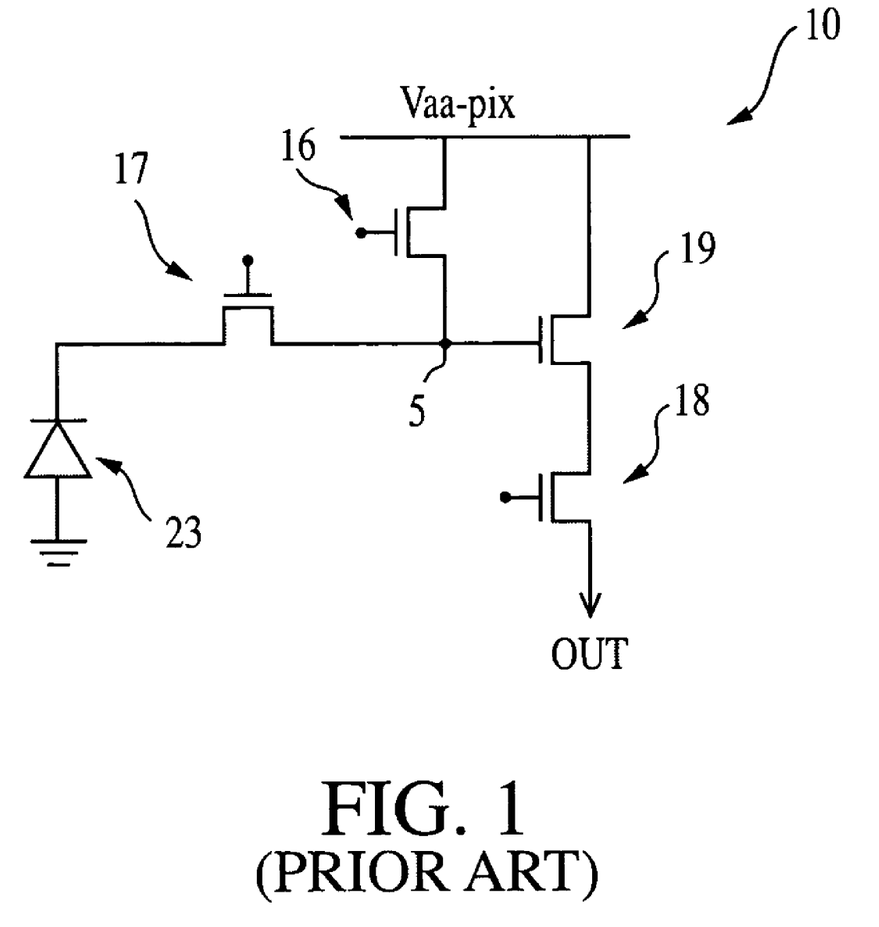
FIG. 1 is a schematic diagram of a conventional pixel cell.

A schematic diagram of a conventional CMOS pixel cell 10 is shown in FIG. 1. The illustrated CMOS pixel cell 10 is a four transistor (4T) cell. The CMOS pixel cell 10 generally comprises a photo-conversion device 23 for generating and collecting charge generated by light incident on the pixel cell 10, and a transfer transistor 17 for transferring photoelectric charges from the photo-conversion device 23 to a sensing node, typically a floating diffusion region 5. The floating diffusion region 5 is electrically connected to the gate of an output source follower transistor 19. The pixel cell 10 also includes a reset transistor 16 for resetting the floating diffusion region 5 to a predetermined voltage; and a row select transistor 18 for outputting a signal from the source follower transistor 19 to an output terminal in response to an address signal.

Figure 2:
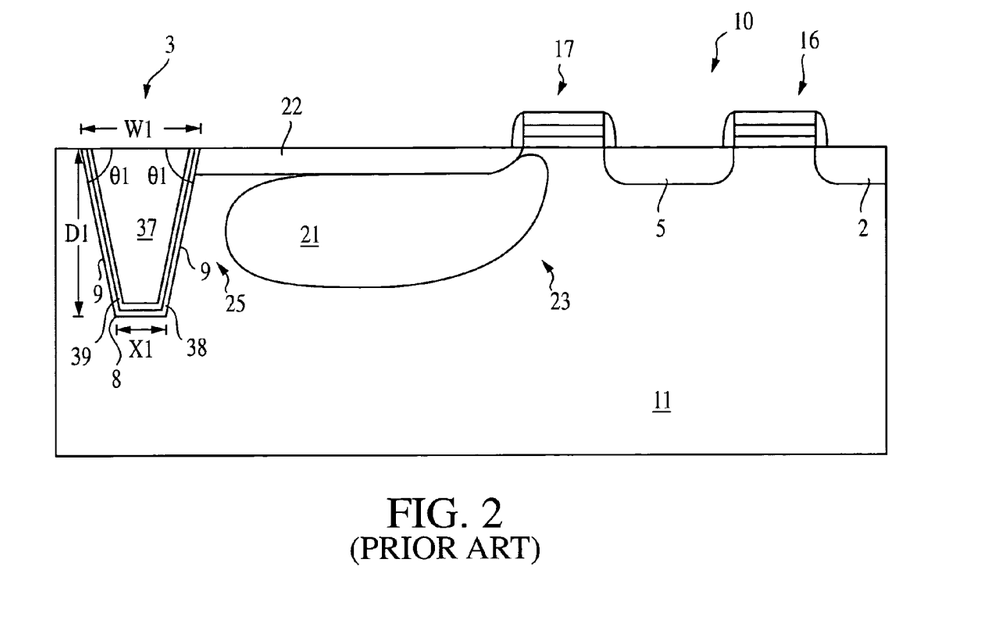
FIG. 2 is a cross-sectional view of a conventional pixel cell.

FIG. 2 is a cross-sectional view of a portion of the pixel cell 10 of FIG. 1 showing the photo-conversion device 23, transfer transistor 17 and reset transistor 16. The exemplary CMOS pixel cell 10 has a photo-conversion device 23 may be formed as a pinned photodiode. The photodiode 23 has a p-n-p construction comprising a p-type surface layer 22 and an n-type photodiode region 21 within a p-type active layer 11. The photodiode 23 is adjacent to and partially underneath the transfer transistor 17. The reset transistor 16 is on a side of the transfer transistor 17 opposite the photodiode 23. As shown in FIG. 2, the reset transistor 16 includes a source/drain region 2. The floating diffusion region 5 is between the transfer and reset transistors 17, 16.

In the CMOS pixel cell 10 depicted in FIGS. 1 and 2, electrons are generated by light incident on the photo-conversion device 23 and are stored in the n-type photodiode region 21. These charges are transferred to the floating diffusion region 5 by the transfer transistor 17 when the transfer transistor 17 is activated. The source follower transistor 19 produces an output signal from the transferred charges. A maximum output signal is proportional to the number of electrons extracted from the n-type photodiode region 21.

Conventionally, a shallow trench isolation (STI) region 3 adjacent to the charge collection region 21 is used to isolate the pixel cell 10 from other pixel cells and devices of the image sensor. The STI region 3 is typically formed using a conventional STI process. The STI region 3 is typically lined with an oxide liner 38 and filled with a dielectric material 37. Also, the STI region 3 can include a nitride liner 39. The nitride liner 39 provides several benefits, including improved corner rounding near the STI region 3 corners, reduced stress adjacent the STI region 3, and reduced leakage for the transfer transistor 17.

The trench isolation region 3 is typically formed using a conventional STI process. The STI region 3 is formed to a depth between 2000 Angstroms (Å) and 6000 Å. The sidewalls 9 of the STI region 3 are formed at an angle $\theta_1$, which is typically between 85 degrees and 90 degrees. The STI region 3 is typically filled with a dielectric material and can include a nitride liner (not shown).

A common problem associated with the above described STI region 3 is dangling bonds (e.g., dangling silicon (Si—) bonds) at the surface of the substrate 11 and along the trench bottom 8 and sidewalls 9. The dangling bonds create a high density of trap sites along the trench bottom 8 and sidewalls 9. As a result of these trap sites formed along the bottom 8 and sidewalls 9 of the STI region 3, current generation near and along the trench bottom 8 and sidewalls 9 can be significant. Current generated from trap sites inside or near the photodiode 23 depletion region causes undesired dark current and increased fixed pattern noise.

Additionally, while the nitride liner 39 provides certain benefits, it also has undesirable effects. The portion of the transfer transistor 17 gate that overlaps the STI region 3 (not shown) can undesirably act as a second transistor with a threshold voltage "field Vt" causing current leakage. Without the nitride liner 39, the field Vt is typically approximately 15 volts (V), which is sufficiently high to minimize leakage. With the nitride liner 39, as shown in FIG. 2, the field Vt is lowered, causing increased leakage. It is believed that the decreased field Vt is due to fixed charge or surface states from the nitride liner 39.

Further, for proper operation of the pinned photodiode 23, the p-type surface implant region 22 must be continuously to the p-type substrate 11. FIG. 2 illustrates this as link region 25. Accordingly, a continuous p-type region from p-type surface layer 22 through link region 25 to the p-type substrate 11 must be established for the pinned photodiode 23 to work properly. In situations where this does not occur, e.g., where the link region 25 becomes depleted, the p-type surface region 22 becomes isolated from the p-type substrate 11 and results in a floating p-type surface region 22 rather a pinned region 22. This results in a dramatic capacitance loss in the pinned photodiode 23 and therefore, decreased image sensor performance.

It is desirable to have an improved isolation structure for reducing dark current and fixed pattern noise. It is also desirable to have an isolation structure that allows a better connection between the p-type surface region of a pinned photodiode and the substrate.

BRIEF SUMMARY OF THE INVENTION

Exemplary embodiments of the invention provide a pixel cell comprising a substrate having a top surface. A photo-conversion device is at a surface of the substrate and a trench is in the substrate adjacent the photo-conversion device. The trench has sidewalls and a bottom. At least one sidewall is angled less than approximately 85 degrees from the plane of the top surface of the substrate.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), silicon-on-sapphire (SOS), and silicon-on-nothing (SON) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device and transistors for converting electromagnetic radiation to an electrical signal. For purposes of illustration, a portion of a representative pixel cell is illustrated in the figures and description herein, and typically fabrication of all pixel cells in an image sensor will proceed concurrently and in a similar fashion.

Figure 3:
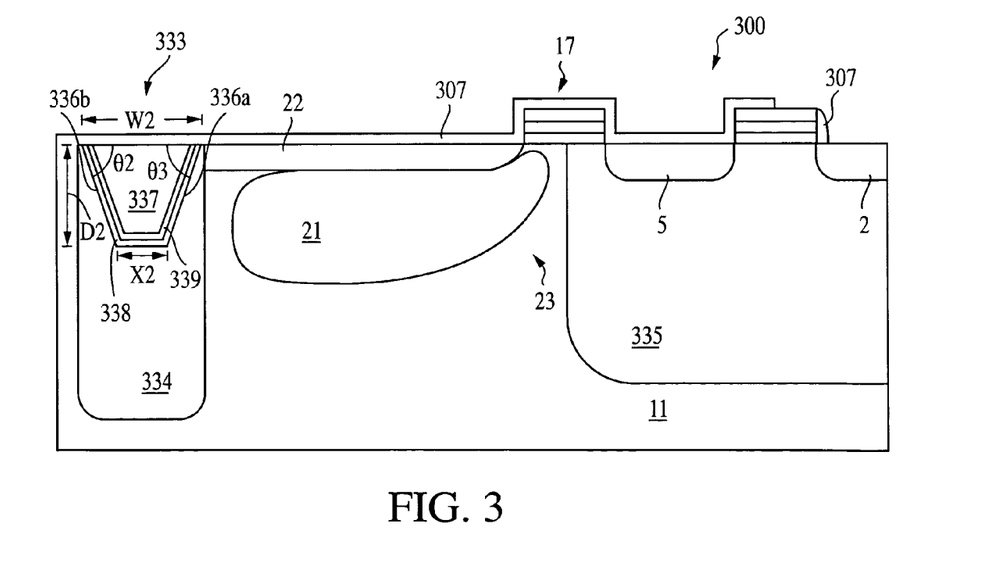
FIG. 3 is a cross-sectional view of a pixel cell according to an exemplary embodiment of the invention.

FIG. 3 is a cross-sectional view of a pixel cell 300 according to an exemplary embodiment of the invention. The pixel cell 300 is similar to the pixel cell 10 depicted in FIGS. 1 and 2, except that the pixel cell 300 includes an improved trench isolation region 333 rather than a conventional STI region 3 (FIG. 2). Also, the pixel cell 300 may include a p-type well 334 surrounding and below the isolation region 333 and a p-type well 335 below the floating diffusion region 5, the reset transistor 16, and a portion of the transfer transistor 17. Although not shown in FIG. 3, the pixel cell 300 also includes source follower and row select transistors 19, 18, respectively (as shown in FIG. 1).

The illustrated isolation region 333 has a unique trench geometry for use adjacent a photo-conversion device, e.g., photodiode 23. The isolation region 333 is formed such that its sidewalls 336a, 336b are at angles θ3, θ2, respectively, from the plane of the top surface of the substrate 11. The angles θ2, θ3 are less than approximately 85 degrees. Preferably, the angles θ2, θ3 are within the range of approximately 15 degrees to approximately 70 degrees, and more preferably are within the range of approximately 60 degrees to approximately 70 degrees. In the illustrated embodiment, the first angle θ2 is approximately equal to the second angle θ3, but the angles θ2, θ3 can be different from each other. Preferably, the isolation region 333 has a depth D2 within the range of approximately 500 Angstroms (Å) to approximately 5000 Å, and more preferably within the range of approximately 1000 Å to approximately 3000 Å.

The angles θ2, θ3, depth D2, surface width W2, and bottom width X2 are configured to minimize the substrate 11 surface area used by the isolation region 333. For example, the angles θ3, θ2 of the isolation region 333 sidewalls 336a, 336b are shallow as compared to the angles θ1 of the conventional STI region 3 sidewall 9 (FIG. 2). In accordance with basic geometry, at a same surface width W1=W2, and a same depth D1=D2, the total length of the bottom width plus the sidewalls, X2+336a+336b, of the isolation region 333 will be less than that of the STI region 3 (FIG. 2), X1+9+9. That is, the isolation region 333 will occupy less surface area of the substrate 11 than does the conventional STI region 3, and therefore, will have fewer dangling bonds than the conventional STI region 3.

By minimizing the substrate 11 surface area and the dangling bonds, the effects of the dangling bonds are also minimized. Additionally, the reduced substrate 11 surface area results in less nitride liner being required in the isolation region 333 and, therefore, an increased field Vt as compared to the conventional pixel cell 10 (FIGS. 1 and 2). Further, because of the shallow second angle θ3, the sidewall 336a, and the isolation region 333, are a greater distance from the photodiode 23 than when a steeper angle, e.g., angle θ1 (FIG. 2) is used. By maximizing the distance between the photodiode 23 and the sidewall 336a and the isolation region 333, less charge from the sidewall 336a will drift into the photodiode 23, thereby reducing pixel noise and bright signal bits and providing an increased region for linking the p-type surface layer 22 of the photodiode 23 with the p-well 334.

Also, the isolation region 333 can reduce cross-talk. A certain amount of light incident on the interfaces of the materials within the isolation region 333 and the substrate 11 are reflected according to the laws of reflection. As the angles θ2, θ3 decrease, light passing through the photodiode 23 will tend to be reflected more toward the substrate 11, rather than toward neighboring pixel cells (not shown). This is one more advantage of the invention.

FIGS. 4A-4J depict the formation of pixel cell 300 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 4A:
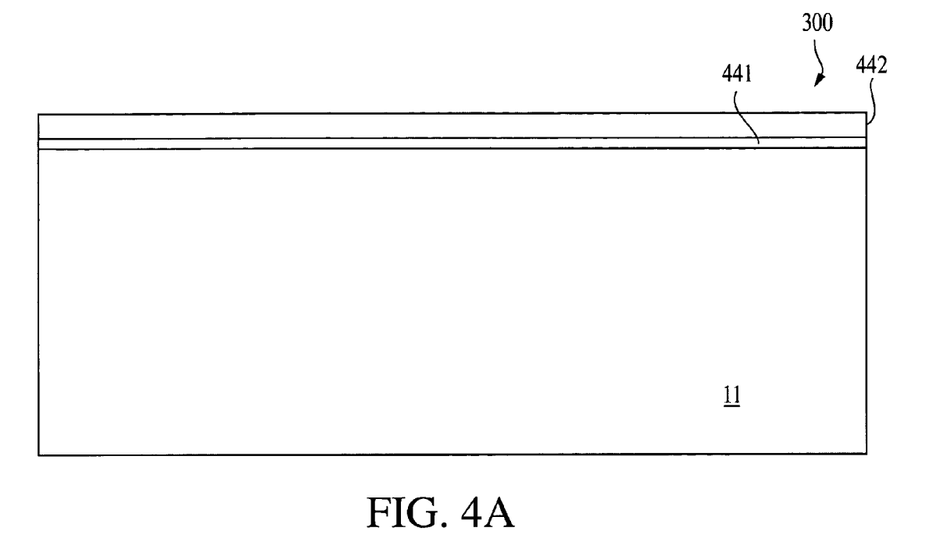
FIG. 4A depicts the pixel cell of FIG. 2 at an initial stage of processing.

As illustrated in FIG. 4A, a pad oxide layer 441, which can be a thermally grown oxide, is formed on the substrate 11. A sacrificial layer 442 is formed on the pad oxide layer 441. The sacrificial layer 442 can be a nitride or dielectric anti-reflective coating (DARC) layer.

Figure 4B:
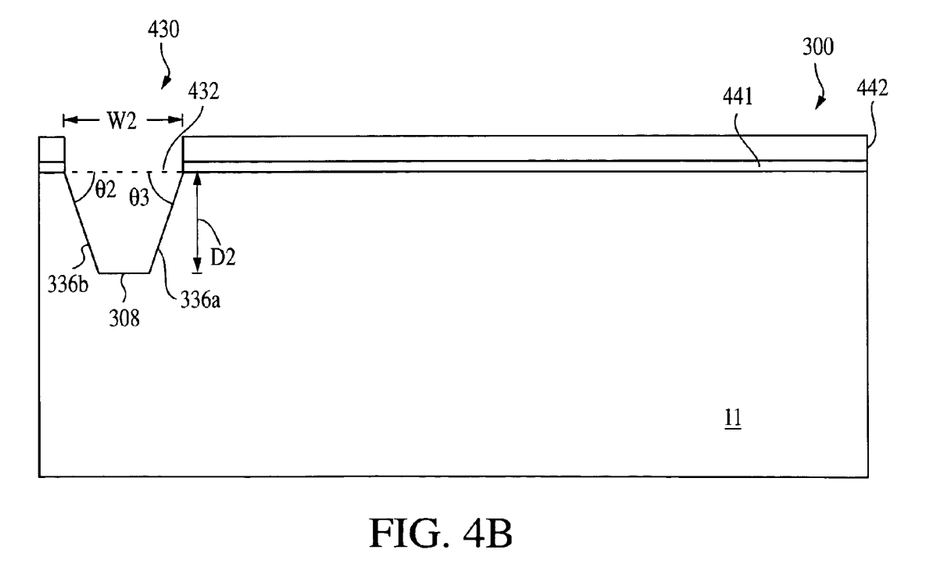
FIGS. 4B-4J depict the pixel cell of FIG. 2 at intermediate stages of processing.

FIG. 4B depicts the formation of a trench 430 in the substrate 11 and through the layers 441, 442 on the substrate 11. The trench 430 is formed such that the sidewalls 336a, 336b are at angles θ3, θ2, respectively, from the plane 432 of the top surface of the substrate 11. The angles θ2, θ3 are within the range of approximately 15 degrees to approximately 85 degrees. In the illustrated embodiment of FIG. 4C, the first angle θ2 is approximately equal to the second angle θ3. The trench 430 is formed having a depth within the range of approximately 500 Å to approximately 5000 Å, and preferably within the range of approximately 1000 Å to approximately 3000 Å.

The trench 430 can be formed by any known technique. For example, a patterned photoresist layer (not shown) is used as a mask for an etching process. The first etch is conducted utilizing dry plasma conditions and difloromethane/carbon tetrafluoride ($CH_2F_2/CF_4$) chemistry. Such etching effectively etches both silicon nitride layer 442 and pad oxide layer 441 to form an opening extending therethrough and stops upon reaching the substrate 11. A second etch is conducted to extend the openings into the substrate 11. The second etch is a dry plasma etch utilizing difloromethane/hydrogen bromide ($CH_2F_2/HBr$) chemistry. The timing of the etch is adjusted to form the trench 430 within substrate 11 to the desired depth. A shorter etch time results in a shallower trench 430. The photoresist mask (not shown) is removed using standard photoresist stripping techniques, preferably by a plasma etch.

Figure 4C:
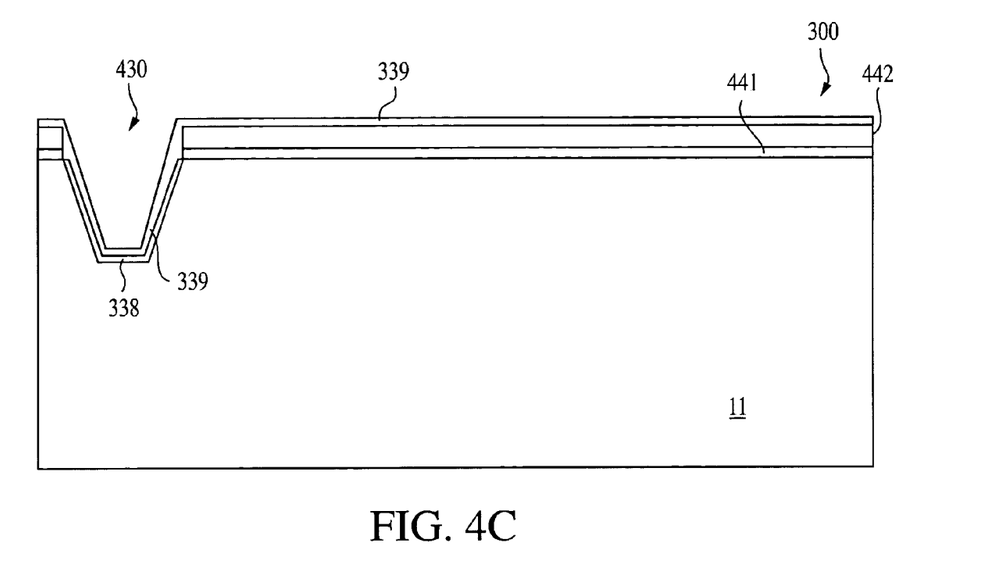

A thin insulator layer 338, between approximately 50 Å and approximately 250 Å thick, is formed on the trench 430 sidewalls 336a, 336b and bottom 308, as shown in FIG. 4C. In the embodiment depicted in FIG. 4C, the insulator layer 338 is an oxide layer 338 is preferably grown by thermal oxidization.

The trench 430 can be lined with a barrier film 339. In the embodiment shown in FIG. 4C, the barrier film 339 is a nitride liner, for example, silicon nitride. The nitride liner 339 is formed by any suitable technique, to a thickness within the range of approximately 50 Å to approximately 250 Å. For example, as is known in the art, a silicon nitride liner 339 can be deposited using ammonia ($NH_3$) and silane ($SiH_4$).

Figure 4D:
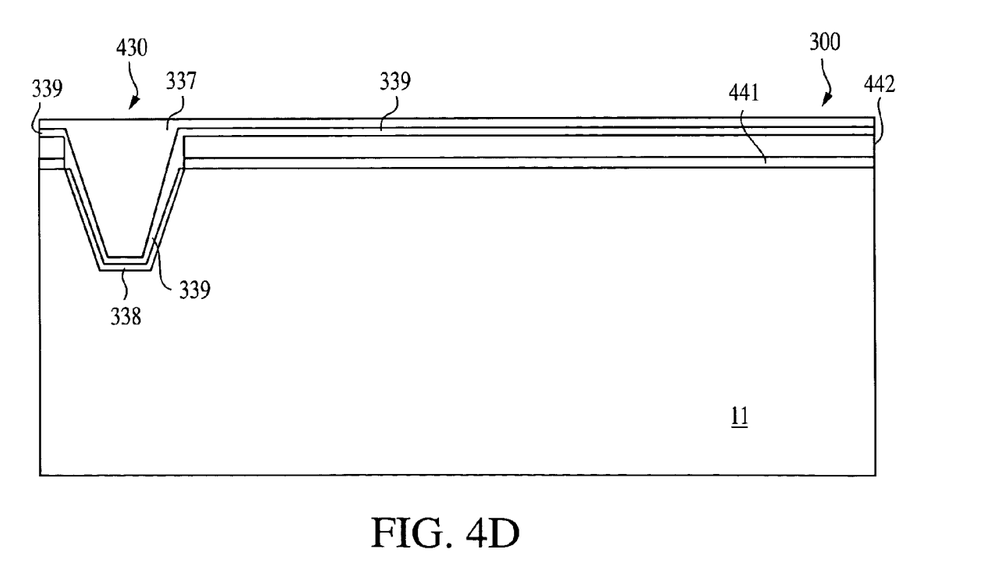

The trench 430 is filled with a dielectric material 337 as shown in FIG. 4D. The dielectric material 337 may be an oxide material, for example a silicon oxide, such as SiO or silicon dioxide ($SiO_2$); oxynitride; a nitride material, such as silicon nitride; silicon carbide; a high temperature polymer; or other suitable dielectric material. In the illustrated embodiment, the dielectric material 337 is a high density plasma (HDP) oxide.

Figure 4E:
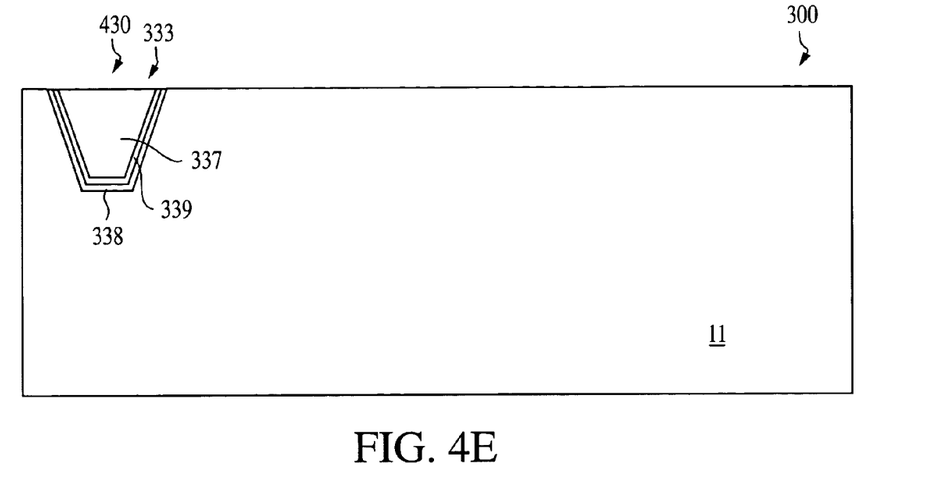

A chemical mechanical polish (CMP) step is conducted to remove the nitride layer 339 over the surface of the substrate 11 outside the trench 430 and the nitride layer 442, as shown in FIG. 4E. Also, the pad oxide layer 441 is removed, for example, using a field wet buffered-oxide etch step and a clean step.

Figure 4F:
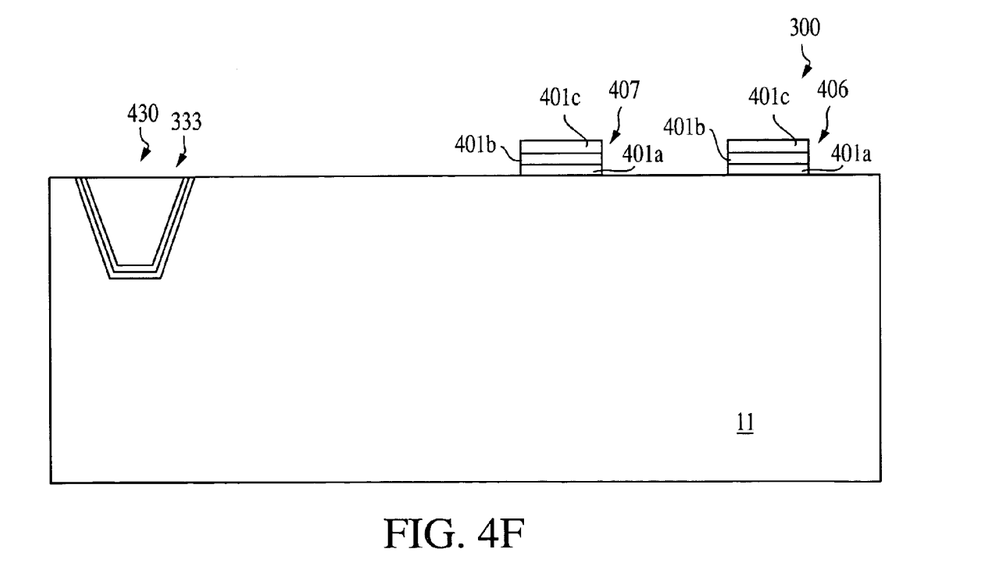

FIG. 4F depicts the formation of the transfer transistor 17 (FIG. 3) gate stack 407 and the reset transistor 16 (FIG. 3) gate stack 406. Although not shown, the source follower and row select transistors 19, 18 (FIG. 1), respectively, can be formed concurrently with the transfer and reset transistors 17, 16 as described below.

To form the transistor gate stacks 407, 406 as shown in FIG. 4F, a first insulating layer 401a of, for example, silicon oxide is grown or deposited on the substrate 11. The first insulating layer 401a serves as the gate oxide layer for the subsequently formed transistor gate 401b. Next, a layer of conductive material 401b is deposited over the oxide layer 401a. The conductive layer 401b serves as the gate electrode for the transistors 17, 16 (FIG. 3). The conductive layer 401b may be a layer of polysilicon, which may be doped to a second conductivity type, e.g., n-type. A second insulating layer 401c is deposited over the conductive layer 401b. The second insulating layer 401c may be formed of, for example, an oxide ($SiO_2$), a nitride (silicon nitride), an oxynitride (silicon oxynitride), ON (oxide-nitride), NO (nitride-oxide), or ONO (oxide-nitride-oxide).

The gate stack layers 401a, 401b, 401c may be formed by conventional deposition methods, such as chemical vapor deposition (CVD) or plasma enhanced chemical vapor deposition (PECVD), among others. The layers 401a, 401b, 401c are then patterned and etched to form the multilayer gate stacks 407, 406 shown in FIG. 4F.

The invention is not limited to the structure of the gate stacks 407, 406 described above. Additional layers may be added or the gate stacks 407, 406 may be altered as is desired and known in the art. For example, a silicide layer (not shown) may be formed between the gate electrodes 401b and the second insulating layers 401c. The silicide layer may be included in the gate stacks 407, 406, or in all of the transistor gate stack structures in an image sensor circuit, and may be titanium silicide, tungsten silicide, cobalt silicide, molybdenum silicide, or tantalum silicide. This additional conductive layer may also be a barrier layer/refractor metal, such as titanium nitride/tungsten (TiN/W) or tungsten nitride/tungsten ($WN_x/W$), or it could be formed entirely of tungsten nitride ($WN_x$).

Figure 4G:
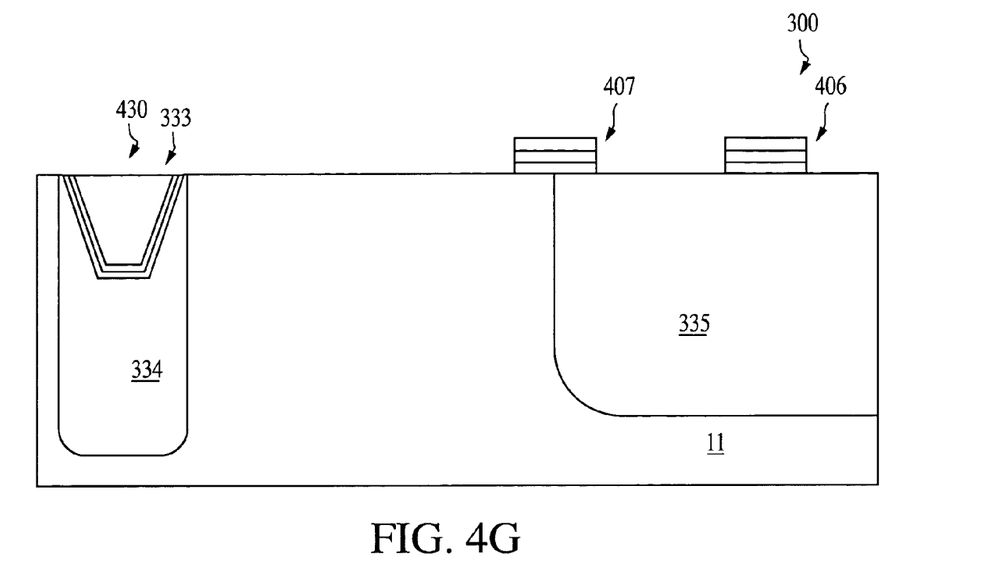

Doped p-type wells 334, 335 are implanted into the substrate 11 as shown in FIG. 4G. The first p-well 334 is formed in the substrate 11 surrounding the isolation region 333 and extending below the isolation region 333. The second p-well 335 is formed in the substrate 11 from a point below the transfer gate stack 407 extending in a direction in the substrate 11 away from where the photodiode 23 (FIG. 3) is to be formed.

The p-wells 334, 335 are formed by known methods. For example, a layer of photoresist (not shown) can be patterned over the substrate 11 having an opening over the area where the p-wells, 334, 335 are to be formed. A p-type dopant, such as boron, can be implanted into the substrate 11 through the opening in the photoresist. The p-wells 334, 335 are formed having a p-type dopant concentration that is higher than adjacent portions of the substrate 11. Alternatively, the p-wells 334, 335 can be formed prior to the formation of the trench 430.

Figure 4H:
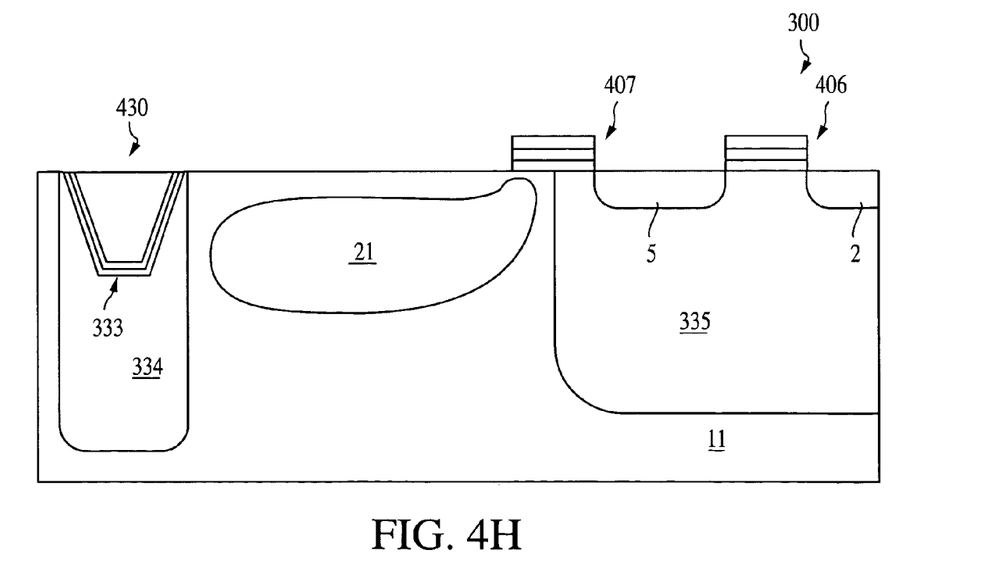

As depicted in FIG. 4H, a doped n-type region 21 is implanted in the substrate 11 (for the photodiode 23 of FIG. 3). For example, a layer of photoresist (not shown) may be patterned over the substrate 11 having an opening over the surface of the substrate 11 where photodiode 23 (FIG. 3) is to be formed. An n-type dopant, such as phosphorus, arsenic, or antimony, may be implanted through the opening and into the substrate 11. Multiple implants may be used to tailor the profile of region 21. If desired, an angled implantation may be conducted to form the doped region 21, such that implantation is carried out at angles other than 90 degrees relative to the surface of the substrate 11.

As shown in FIG. 4H, the n-type region 21 is formed from a point adjacent the transfer gate stack 407 and extending in the substrate 11 between the gate stack 407 and the isolation region 333. The region 21 forms a photosensitive charge accumulating region for collecting photo-generated charge.

The floating diffusion region 5 and source/drain region 2 are implanted by known methods to achieve the structure shown in FIG. 4H. The floating diffusion region 5 and source/drain region 2 are formed as n-type regions. Any suitable n-type dopant, such as phosphorus, arsenic, or antimony, may be used. The floating diffusion region 5 is formed on the side of the transfer gate stack 407 opposite the n-type photodiode region 21. The source/drain region 2 is formed on a side of the reset gate stack 406 opposite the floating diffusion region 5.

Figure 4I:
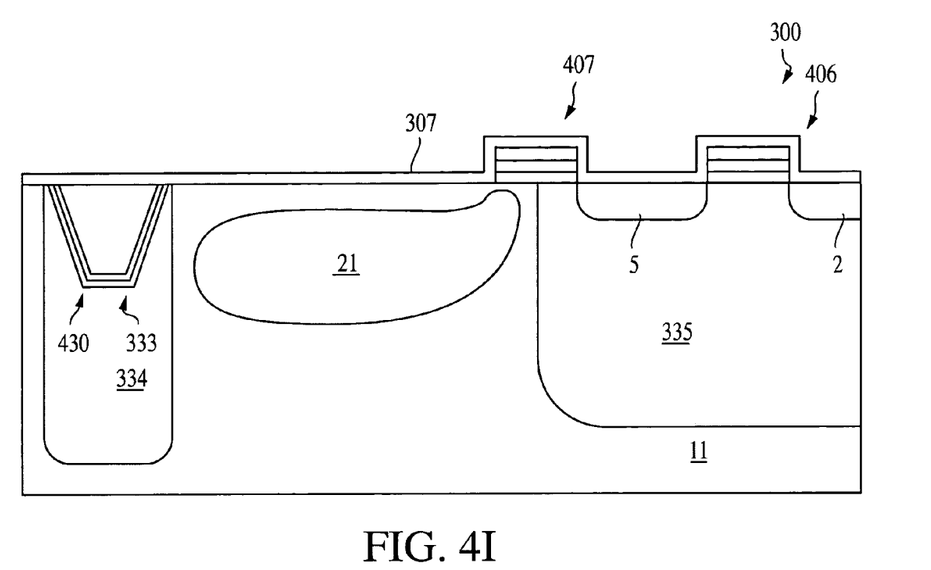

FIG. 4I depicts the formation of a dielectric layer 307. Illustratively, layer 307 is an oxide layer, but layer 307 may be any appropriate dielectric material, such as silicon dioxide, silicon nitride, an oxynitride, or tetraethyl orthosilicate (TEOS), among others, formed by methods known in the art.

Figure 4J:
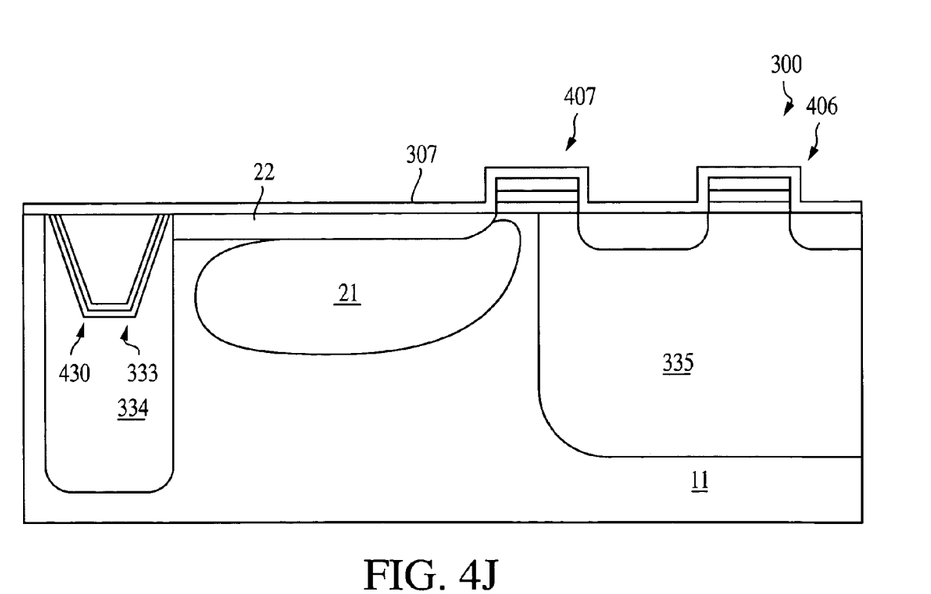

The doped surface layer 22 for the photodiode 23 is implanted, as illustrated in FIG. 4J. Doped surface layer 22 is formed as a highly doped p-type surface layer and is formed to a depth of approximately 0.1 μm. A p-type dopant, such as boron, indium, or any other suitable p-type dopant, may be used to form the p-type surface layer 22.

The p-type surface layer 22 may be formed by known techniques. For example, layer 22 may be formed by implanting p-type ions through openings in a layer of photoresist. Alternatively, layer 22 may be formed by a gas source plasma doping process, or by diffusing a p-type dopant into the substrate 11 from an in-situ doped layer or a doped oxide layer deposited over the area where layer 22 is to be formed.

The oxide layer 307 is etched such that remaining portions form a sidewall spacer on a sidewall of the reset gate stack 406. The layer 307 remains over the transfer gate stack 407, the photodiode 23, the floating diffusion region 5, and a portion of the reset gate stack 406 to achieve the structure shown in FIG. 3. Alternatively, a dry etch step can be conducted to etch portions of the oxide layer 307 such that only sidewall spacers (not shown) remain on the transfer gate stack 407 and the reset gate stack 406.

Conventional processing methods can be used to form other structures of the pixel 300. For example, insulating, shielding, and metallization layers to connect gate lines, and other connections to the pixel 300 may be formed. Also, the entire surface may be covered with a passivation layer (not shown) of, for example, silicon dioxide, borosilicate glass (BSG), phosphosilicate glass (PSG), or borophosphosilicate glass (BPSG), which is CMP planarized and etched to provide contact holes, which are then metallized to provide contacts. Conventional layers of conductors and insulators may also be used to interconnect the structures and to connect pixel 300 to peripheral circuitry.

Figure 5:
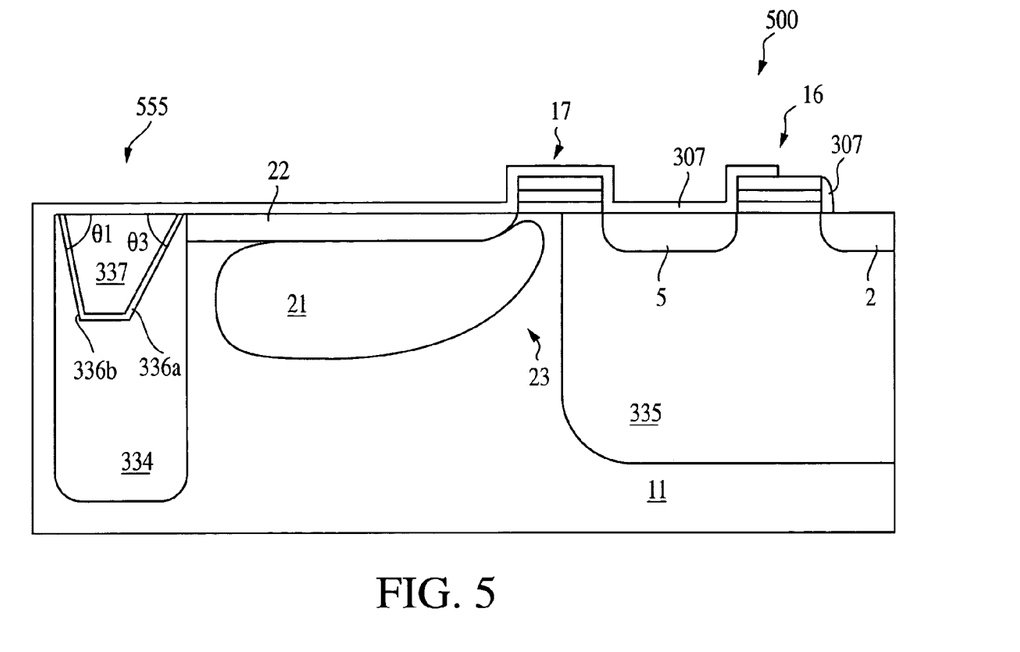
FIG. 5 is a cross-sectional view of a pixel cell according to another exemplary embodiment of the invention.

FIG. 5 depicts a pixel cell 500 according to another embodiment of the invention. The pixel cell 500 is similar to the pixel cell 300 (FIG. 3) except that isolation region 333 sidewall 336b is at a steep conventional angle θ1 from the plane of the top surface of the substrate 11, rather than the first angle θ2 (FIG. 3). In the illustrated embodiment, the conventional angle θ1 is between approximately 85 degrees and approximately 90 degrees. The pixel cell 500 can be formed as described above in connection with FIGS. 4A-4J, but with additional processing steps to form the sidewall 336b at the conventional angle θ1.

While the above embodiments are described in connection with the formation of p-n-p-type photodiodes the invention is not limited to these embodiments. The invention also has applicability to other types of photo-conversion devices, such as a photodiode formed from n-p or n-p-n regions in a substrate, a photogate, or a photoconductor. If an n-p-n-type photodiode is formed the dopant and conductivity types of all structures would change accordingly.

Although the above embodiments are described in connection with 4T pixel cells 300, 500, the configuration of pixel cells, 300, 500 is only exemplary and the invention may also be incorporated into other pixel circuits having different numbers of transistors. Without being limiting, such a circuit may include a three-transistor (3T) pixel cell, a five-transistor (5T) pixel cell, a six-transistor (6T) pixel cell, and a seven-transistor pixel cell (7T). A 3T cell omits the transfer transistor, but may have a reset transistor adjacent to a photodiode. The 5T, 6T, and 7T pixel cells differ from the 4T pixel cell by the addition of one, two, or three transistors, respectively, such as a shutter transistor, a CMOS photogate transistor, and an anti-blooming transistor. Further, while the above embodiments are described in connection with CMOS pixel cells 300, 500, the invention is also applicable to pixel cells in a charge coupled device (CCD) image sensor.

Figure 6:
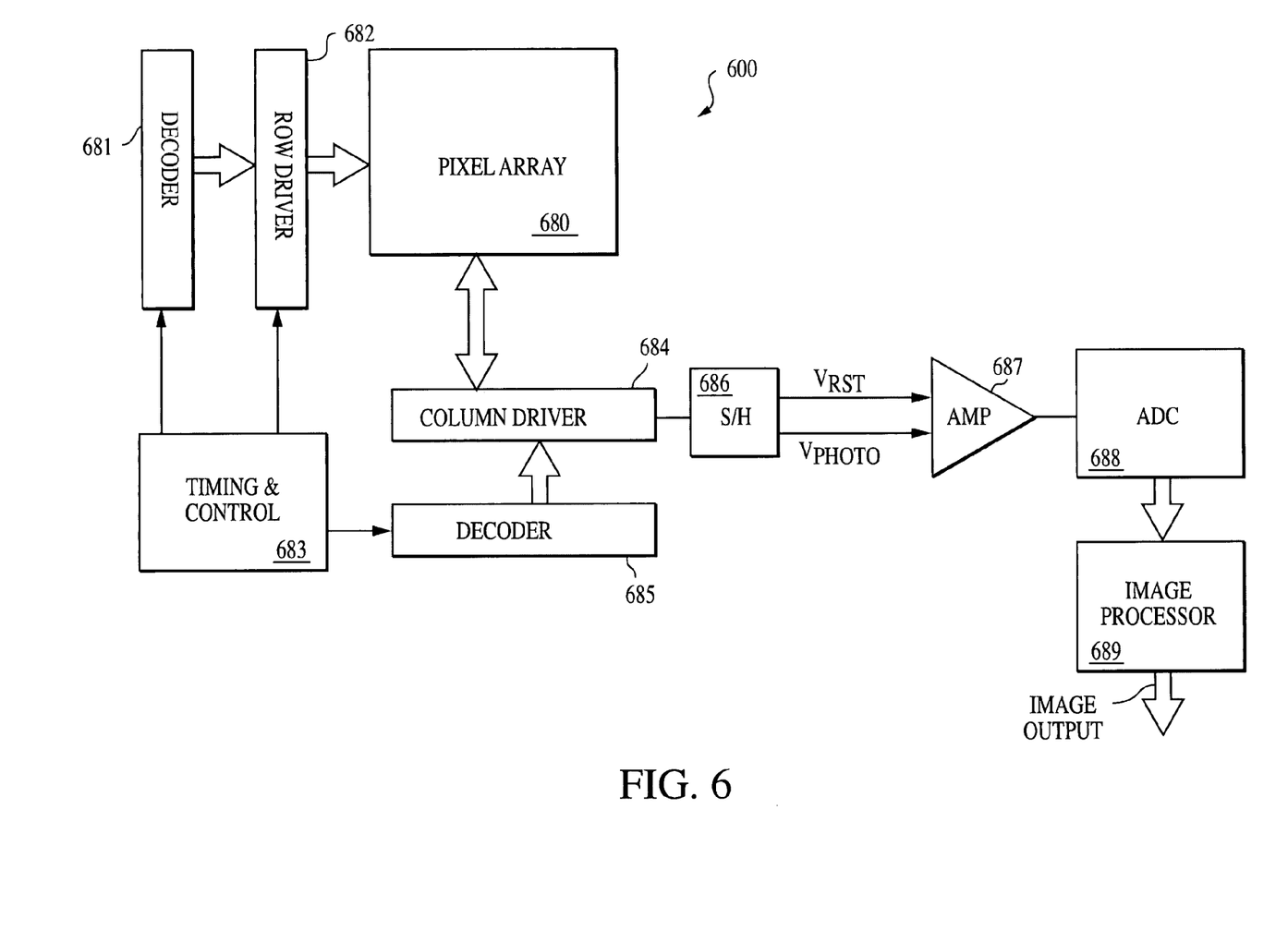
FIG. 6 is a block diagram of a CMOS image sensor according to an exemplary embodiment of the invention.

A typical single chip CMOS image sensor 600 is illustrated by the block diagram of FIG. 6. The image sensor 600 includes a pixel cell array 680 having one or more pixel cells 300 (FIG. 3) or 500 (FIG. 5) described above. The pixel cells of array 680 are arranged in a predetermined number of columns and rows.

The rows of pixel cells in array 680 are read out one by one. Accordingly, pixel cells in a row of array 680 are all selected for readout at the same time by a row select line, and each pixel cell in a selected row provides a signal representative of received light to a readout line for its column. In the array 680, each column also has a select line, and the pixel cells of each column are selectively read out in response to the column select lines.

The row lines in the array 680 are selectively activated by a row driver 682 in response to row address decoder 681. The column select lines are selectively activated by a column driver 684 in response to column address decoder 685. The array 680 is operated by the timing and control circuit 683, which controls address decoders 681, 685 for selecting the appropriate row and column lines for pixel signal readout.

The signals on the column readout lines typically include a pixel reset signal ($V_{rst}$) and a pixel image signal ($V_{photo}$) for each pixel cell. Both signals are read into a sample and hold circuit (S/H) 686 in response to the column driver 684. A differential signal ($V_{rst}$-$V_{photo}$) is produced by differential amplifier (AMP) 687 for each pixel cell, and each pixel cell's differential signal is digitized by analog-to-digital converter (ADC) 688. The analog-to-digital converter 688 supplies the digitized pixel signals to an image processor 689, which performs appropriate image processing before providing digital signals defining an image output.

Figure 7:
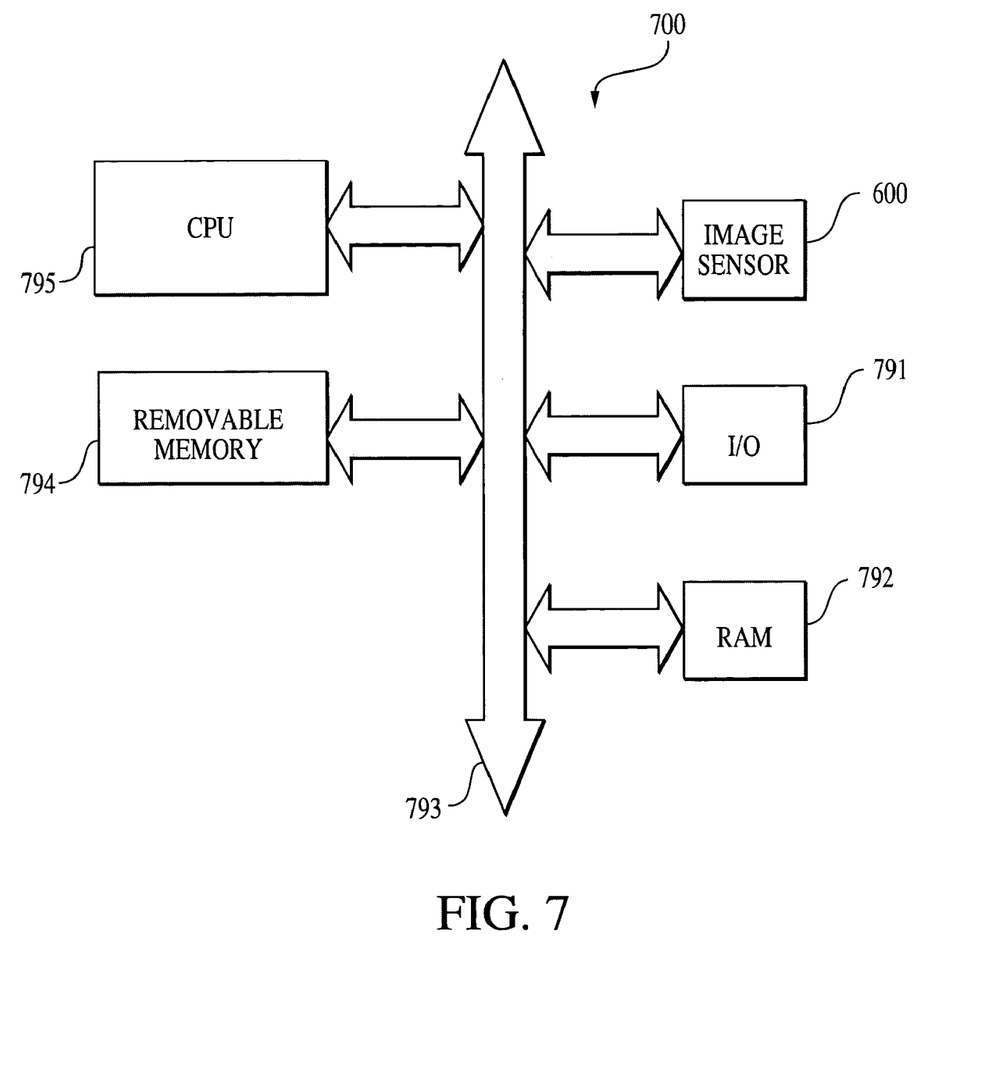
FIG. 7 is a schematic diagram of a computer processor system incorporating the CMOS image sensor of FIG. 5.

FIG. 7 illustrates a processor-based system 700 including the image sensor 600 of FIG. 6. The processor-based system 700 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, and other systems requiring image acquisition.

The processor-based system 700, for example a camera system, generally comprises a central processing unit (CPU) 795, such as a microprocessor, that communicates with an input/output (I/O) device 791 over a bus 793. Image sensor 600 also communicates with the CPU 795 over bus 793. The processor-based system 700 also includes random access memory (RAM) 792, and can include removable memory 794, such as flash memory, which also communicate with CPU 795 over the bus 793. Image sensor 600 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel cell comprising:
a substrate having a top surface;
a photo-conversion device; and
a trench formed in the substrate adjacent the photo-conversion device, the trench having sidewalls, at least one sidewall on the side of the photo-conversion device being angled less than 85 degrees from a plane of a top surface of the substrate and at least a second sidewall being angled greater than or equal to 85 degrees with respect to the plane.

2. The pixel cell of claim 1, wherein the trench is formed to a depth of approximately 500 Å to approximately 5000 Å.

3. The pixel cell of claim 2, wherein the trench is formed to a depth of approximately 1000 Å to approximately 3000 Å.

4. The pixel cell of claim 1, wherein the at least one angled sidewall has an angle within the range of approximately 15 degrees to approximately 70 degrees.

5. The pixel cell of claim 1, wherein the at least one angled sidewall has an angle within the range of approximately 60 degrees to approximately 70 degrees.

6. The pixel cell of claim 1, further comprising a doped well of a first conductivity type formed in the substrate surrounding the trench.

7. The pixel cell of claim 6, wherein the photo-conversion device is a pinned photodiode comprising a doped surface layer of a first conductivity type.

8. The pixel cell of claim 7, wherein the doped surface layer is connected to the doped well.

9. The pixel cell of claim 1, wherein the photo-conversion device is a p-n type photodiode.

10. The pixel cell of claim 1, wherein the photo-conversion device is a photoconductor.

11. The pixel cell of claim 1, wherein the photo-conversion device is a photogate.

12. The pixel cell of claim 1, wherein the trench is at least partially filled with a dielectric material.

13. The pixel cell of claim 1, wherein the trench is lined with nitride.

14. The pixel cell of claim 13, wherein the trench is lined with oxide.

15. The pixel cell of claim 14, wherein the trench is filled with a dielectric material and the nitride liner is between the dielectric material and the oxide liner.

16. The pixel cell of claim 1, wherein the trench is at least partially filled with a material selected from the group consisting of a silicon oxide, a nitride, silicon carbide, a high temperature polymer, and a high density plasma.

17. The pixel cell of claim 1, wherein the pixel cell is part of a CMOS image sensor.

18. The pixel cell of claim 1, wherein the pixel cell is part of a charge coupled device image sensor.

19. A pixel cell comprising:
a substrate having a top surface;
a photo-conversion device; and
a trench formed in the substrate adjacent to the photo-conversion device, the trench having sidewalls and being lined with a nitride liner, a sidewall being angled from a plane of a top surface of the substrate at a respective angle within the range of approximately 60 degrees to approximately 70 degrees and at least a second sidewall being angled greater than or equal to approximately 85 degrees with respect to the plane.

20. A pixel cell comprising:
a substrate having a top surface;
a pinned photodiode having a doped surface layer of a first conductivity type;
a trench formed in the substrate adjacent the pinned photodiode, the trench having sidewalls, at least one sidewall angled from a plane of a top surface of the substrate at a respective angle within the range of approximately 15 degrees to approximately 70 degrees and at least a second sidewall being angled greater than or equal to approximately 85 degrees with respect to the plane; and a doped well of the first conductivity type formed in the substrate surrounding the trench and being connected to the doped surface layer.

21. An image sensor comprising:
a substrate having a top surface; and
an array of pixel cells, at least one pixel cell comprising:
a photo-conversion device at a surface of the substrate; and
a trench formed in the substrate adjacent to the photo-conversion device, the trench having sidewalls, at least one sidewall on a side of the photo-conversion device being angled less than 85 degrees from a plane of a top surface of the substrate and at least a second sidewall being angled greater than or equal to 85 degrees with respect to the plane.

22. The image sensor of claim 21, wherein the trench is formed to a depth of approximately 500 Å to approximately 5000 Å.

23. The image sensor of claim 22, wherein the trench is formed to a depth of approximately 1000 Å to approximately 3000 Å.

24. The image sensor of claim 21, wherein the at least one angled sidewall has an angle within the range of approximately 15 degrees to approximately 70 degrees with respect to the plane.

25. The image sensor of claim 21, wherein the at least one angled sidewall has an angle within the range of approximately 60 degrees to approximately 70 degrees with respect to the plane.

26. The image sensor of claim 21, further comprising a doped well of a first conductivity type formed in the substrate surrounding the trench.

27. The image sensor of claim 26, wherein the photo-conversion device is a pinned photodiode comprising a doped surface layer of a first conductivity type.

28. The image sensor of claim 27, wherein the doped surface layer is connected to the doped well.

29. The image sensor of claim 21, wherein the photo-conversion device is a p-n type photodiode.

30. The image sensor of claim 21, wherein the photo-conversion device is a photoconductor.

31. The image sensor of claim 21, wherein the photo-conversion device is a photogate.

32. The image sensor of claim 21, wherein the trench is lined with nitride.

33. The image sensor of claim 32, wherein the trench is lined with oxide.

34. The image sensor of claim 33, wherein the trench is filled with a dielectric material and the nitride liner is between the dielectric material and the oxide liner.

35. The image sensor of claim 21, wherein the trench is at least partially filled with a dielectric material.

36. The image sensor of claim 21, wherein the image sensor is a CMOS image sensor.

37. The image sensor of claim 21, wherein the image sensor is a charge coupled device image sensor.

38. The pixel cell of claim 27, further comprising forming a nitride layer inside the trench.

39. The pixel cell of claim 38, further comprising forming an oxide layer inside the trench.

40. The pixel cell of claim 39, further comprising filling the trench with a dielectric material, and wherein the act of forming the nitride liner comprises forming the nitride layer between the oxide layer and the dielectric material.

41. A pixel cell comprising:

a substrate having a top surface;

a photo-conversion device; and a trench formed in the substrate adjacent the photo-conversion device, the trench having sidewalls, at least one sidewall being angled less than 85 degrees from a plane of a top surface of the substrate and at least a second sidewall being angled greater than or equal to 85 degrees with respect to the plane.

* * * * *